US010319851B2

(12) United States Patent
Chun et al.

(10) Patent No.: US 10,319,851 B2
(45) Date of Patent: Jun. 11, 2019

(54) SEMICONDUCTOR DEVICE AND METHOD FOR MANUFACTURING SAME

(71) Applicant: Hyundai Motor Company, Seoul (KR)

(72) Inventors: Dae Hwan Chun, Gwangmyeong-si (KR); Youngkyun Jung, Seoul (KR); NackYong Joo, Hanam-si (KR); Junghee Park, Suwon-si (KR); JongSeok Lee, Suwon-si (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 15/377,708

(22) Filed: Dec. 13, 2016

(65) Prior Publication Data

US 2018/0108774 A1    Apr. 19, 2018

(30) Foreign Application Priority Data

Oct. 14, 2016 (KR) ........................ 10-2016-0133554

(51) Int. Cl.
| | |
|---|---|
| *H01L 29/78* | (2006.01) |
| *H01L 21/265* | (2006.01) |
| *H01L 21/306* | (2006.01) |
| *H01L 29/16* | (2006.01) |
| *H01L 29/423* | (2006.01) |
| *H01L 29/66* | (2006.01) |
| *H01L 21/033* | (2006.01) |

(52) U.S. Cl.
CPC ...... *H01L 29/7827* (2013.01); *H01L 21/0334* (2013.01); *H01L 21/26506* (2013.01); *H01L 21/30604* (2013.01); *H01L 29/1608* (2013.01); *H01L 29/4236* (2013.01); *H01L 29/66068* (2013.01); *H01L 29/66666* (2013.01)

(58) Field of Classification Search
CPC ........... H01L 29/7827; H01L 29/66666; H01L 29/4236
See application file for complete search history.

(56) References Cited

U.S. PATENT DOCUMENTS

| | | | | |
|---|---|---|---|---|
| 6,057,558 | A * | 5/2000 | Yamamoto | .......... H01L 29/0847 257/77 |
| 7,910,437 | B1 * | 3/2011 | Baek | ................. H01L 29/42368 438/268 |
| 8,809,945 | B2 * | 8/2014 | Wada | ...................... H01L 29/24 257/330 |

(Continued)

FOREIGN PATENT DOCUMENTS

| | | |
|---|---|---|
| JP | 2010087133 A | 4/2010 |
| JP | 2011204761 A | 10/2011 |

(Continued)

*Primary Examiner* — Jamie C Niesz
(74) *Attorney, Agent, or Firm* — Slater Matsil, LLP

(57) ABSTRACT

A semiconductor device includes an n+ type silicon carbide substrate, an n− type layer, an n type layer, a plurality of trenches, a p type region, an n+ type region, a gate insulating film, a gate electrode, a source electrode, a drain electrode, and a channel. The plurality of trenches is disposed in a planar matrix shape. The n+ type region is disposed in a planar mesh type with openings, surrounds each of the trenches, and is in contact with the source electrode between the trenches adjacent to each other in a planar diagonal direction. The p type region is disposed in the opening of the n+ type region in a planar mesh type.

20 Claims, 10 Drawing Sheets

(56) References Cited

U.S. PATENT DOCUMENTS

| | | | |
|---|---|---|---|
| 9,099,553 B2* | 8/2015 | Masuda | H01L 29/6606 |
| 2013/0285140 A1 | 10/2013 | Kagawa et al. | |
| 2014/0175459 A1 | 6/2014 | Yamamoto et al. | |
| 2017/0012108 A1* | 1/2017 | Sakakibara | H01L 21/2033 |

FOREIGN PATENT DOCUMENTS

| | | |
|---|---|---|
| JP | 2012169384 A | 9/2012 |
| JP | 2015128180 A | 7/2015 |
| KR | 100204033 B1 | 6/1999 |
| KR | 1020160056636 A | 5/2016 |
| KR | 1020160071901 A | 6/2016 |

* cited by examiner

SEMICONDUCTOR DEVICE AND METHOD FOR MANUFACTURING SAME

CROSS-REFERENCE TO RELATED APPLICATIONS

This application claims priority to and the benefit of Korean Patent Application No. 10-2016-0133554 filed in the Korean Intellectual Property Office on Oct. 14, 2016, the entire contents of which are incorporated herein by reference.

TECHNICAL FIELD

The present invention relates to a semiconductor device, e.g., containing silicon carbide (SiC), and a method for manufacturing the same.

BACKGROUND

A power semiconductor device requires a low turn-on resistance or a low saturation voltage to reduce the power loss in a conduction state while providing a flow of very large current. Further, the powder semiconductor device basically requires a characteristic in which the powder semiconductor device withstands a reverse high voltage of the P-N junction which is applied to both ends of the power semiconductor device in a turn-off state or at the moment when a switch is turned-off, that is, a high breakdown voltage characteristic.

Out of powder semiconductor devices, a metal oxide semiconductor field effect transistor (MOSFET) is the most general field effect transistor in digital circuits and analog circuits.

MOSFET may be classified into planar gate MOSFET and trench gate MOSFET according to the type of the channel. The planar gate MOSFET has a long current path since the channel region is positioned in parallel with a semiconductor surface, and has a relatively high turn-on resistance due to the presence of a junction field effect transistor (JFET) region. The trench gate MOSFET does not have a JFET region, but can reduce the breakdown voltage due to the electric field concentrating on the bottom end of the trench.

The above information disclosed in this Background section is only for enhancement of understanding of the background of the invention and therefore it may contain information that does not form the prior art that is already known in this country to a person of ordinary skill in the art.

SUMMARY

The present invention has been made in an effort to provide a silicon carbide semiconductor device including vertical and horizontal channels.

An exemplary embodiment of the present invention provides a semiconductor device including an n+ type silicon carbide substrate, an n− type layer, an n type layer, a plurality of trenches, a p type region, an n+ type region, a gate insulating film, a gate electrode, a source electrode, a drain electrode, and a channel. The plurality of trenches are disposed in a planar matrix shape. The n+ type region is disposed in a planar mesh type with openings, surrounds each of the trenches, and is in contact with the source electrode between the trenches adjacent to each other in a planar diagonal direction. The p type region is disposed in the opening of the n+ type region in a planar mesh type.

The n− type layer may be disposed on a first surface of the n+ type silicon carbide substrate; the n type layer, the plurality of trenches, and the p type region may be disposed on the n− type layer. The p type region may be disposed on a side surface of each of the trenches. The n+ type region may be disposed between the side surface of each of the trenches and the p type region, and the ion doping concentration of the n type layer may be higher than the ion doping concentration of the n− type layer.

Each of the trenches may include a first trench and a second trench extended from a lower surface of the first trench, and the width of the first trench may be larger than the width of the second trench.

The n+ type region may be in contact with the side surface and the lower surface of the first trench, and the p type region may be in contact with a side surface of the second trench.

The gate insulating film may be disposed inside the trench, on the n type layer, on the p type region, and the n+ type region, and may expose the n+ type region between the trenches adjacent to each other in a planar diagonal direction.

The gate electrode may be disposed on the gate insulting film, and may include a first electrode disposed inside the trench and a second electrode disposed on the n type layer, on the p type region, and on the n+ type region.

The second gate electrode may interconnect the first gate electrodes adjacent to each other between the trenches adjacent to each other in planar horizontal and vertical directions.

The channel may include a first channel disposed in the p+ type region in contact with the side surface of the second trench, and a second channel adjacent to the n+ type region in contact with the side surface of the first trench and disposed in the p type region disposed below the second trench electrode.

The semiconductor device may further include an oxide film disposed on the gate electrode, and the source electrode may be disposed on the oxide film and the n+ region.

The drain electrode may be disposed on a second surface of the n+ type silicon carbide substrate.

Another embodiment of the present invention provides a method for manufacturing a semiconductor device. The method includes: sequentially forming an n− type layer and an n type layer on a first surface of an n+ type silicon carbide substrate; forming a plurality of first trenches in the n type layer; injecting p type ions into each of the first trenches to form a p type region below a side surface and a lower surface of each of the first trenches; injecting n+ type ions into the p type region to form an n+ type region between each of the first trenches and the p type region; etching the n+ type region and the p type region below the lower surface of each of the first trenches to form a second trench; forming a gate insulating film inside the first trench and the second trench and on the p type region and the n+ type region; forming a gate electrode on the gate insulating film; forming an oxide film on the gate electrode; forming a source electrode on the oxide film and the n+ type region; forming a drain electrode on a second surface of the n+ type silicon carbide substrate, wherein the plurality of first trenches is disposed in a planar matrix shape, wherein the n+ type region is disposed in a planar mesh type with openings, surrounds each of the first trenches, and is in contact with the source electrode between the trenches adjacent to each other in a planar diagonal direction, and wherein the p type region is formed in the opening of the n+ type region in a planar mesh type.

According to an embodiment of the present invention, the semiconductor includes the vertical and horizontal channels, and thus can improve the current density at the time of applying a forward voltage. Accordingly, the area of the semiconductor device according to an embodiment of the present invention can be reduced.

Figure 1:
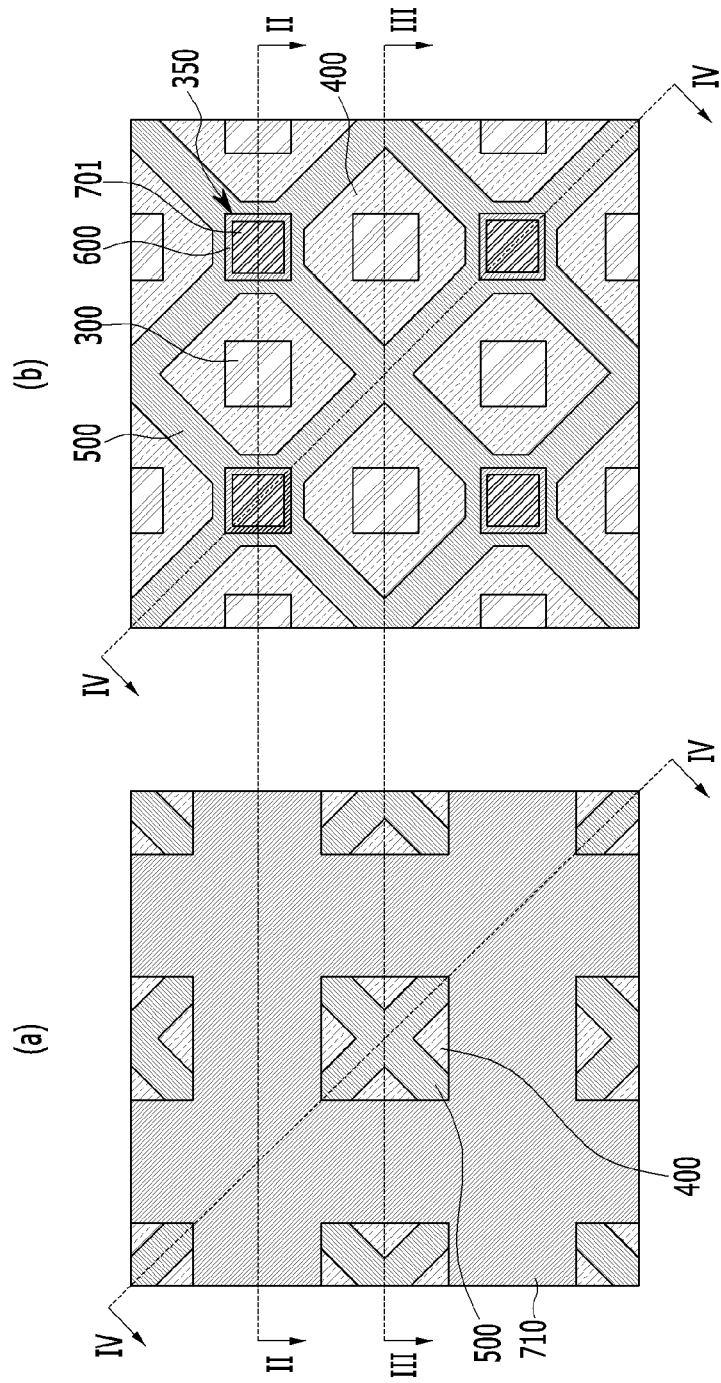
FIG. 1 is a view illustrating an example of a layout of a semiconductor device according to an embodiment of the present invention.

The following reference symbols can be used in conjunction with the drawings:
100: n+ type silicon carbide substrate
200: n− type layer
300: n type layer
350: trench
351: first trench
352: second trench
400: p type region
451: first channel
452: second channel
500: n+ type region
600: gate insulating film
700: gate electrode
701: first gate electrode
702: second gate electrode
800: source electrode
900: drain electrode

DETAILED DESCRIPTION OF ILLUSTRATIVE EMBODIMENTS

Exemplary embodiments of the present invention will be described in detail with reference to the accompanying drawings. However, the present invention is not limited to the embodiments described herein, and thus may be embodied in many different forms. Rather, these embodiments are provided so that this disclosure will be thorough and complete, and will fully convey the scope of the invention to those skilled in the art.

In the drawings, the thickness of layers, films, panels, regions, etc., are exaggerated for clarity. Further, it will be understood that when a layer is referred to as being "on" another layer or a substrate, it may be formed directly on another layer or the substrate or a third layer may be interposed therebetween.

Figure 2:
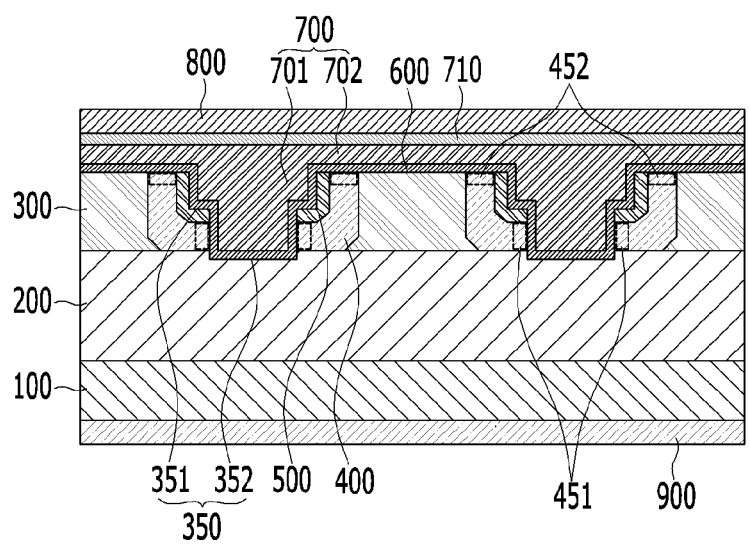
FIG. 2 is a view illustrating an example of a cross section cut along line II-II in FIG. 1.
Figure 3:
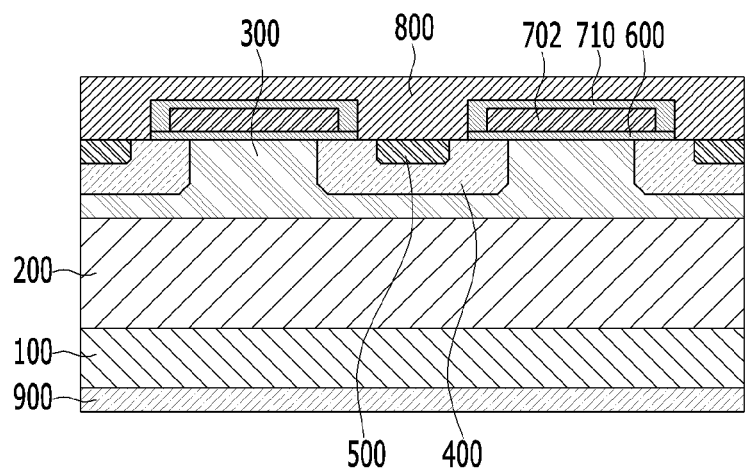
FIG. 3 is a view illustrating an example of a cross section cut along line III-III in FIG. 1.
Figure 4:
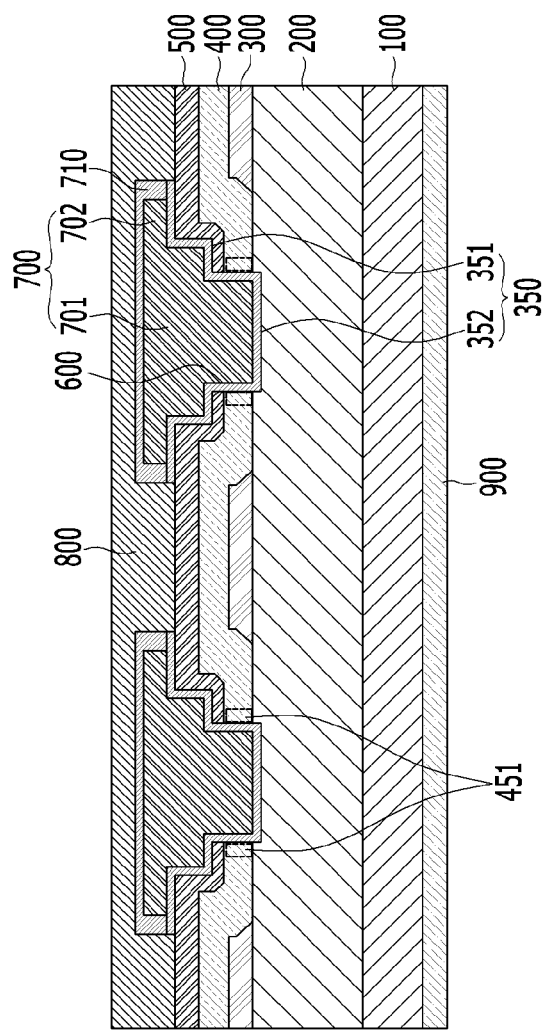
FIG. 4 is a view illustrating an example of a cross section cut along line IV-IV in FIG. 1.

FIG. 1 is a view illustrating an example of a layout of a semiconductor device according to an embodiment of the present invention. FIG. 2 is a view illustrating an example of a cross section cut along line II-II in FIG. 1. FIG. 3 is a view illustrating an example of a cross section cut along line III-III in FIG. 1. FIG. 4 is a view illustrating an example of a cross section cut along line IV-IV in FIG. 1.

Referring to FIGS. 1 to 4, a semiconductor device according to an embodiment of the present invention includes an n+ type silicon carbide substrate 100, an n− type layer 200, an n type layer 300, a plurality of trenches 350, a p type region 400, an n+ type region 500, a gate electrode 700, a source electrode 800, and a drain electrode 900.

FIG. 1(*a*) is a view illustrating an example of a layout of a semiconductor device, of which the source electrode 800 is omitted, and FIG. 1(*b*) is a view illustrating an example of a layout of a semiconductor device, of which the source electrode 800 and a part of the gate electrode 700 are omitted.

The plurality of trenches 350 are disposed in a planar matrix type. The n+ type region 500 is disposed in a planar mesh type with openings, and surrounds respective trenches 350. The n+ type region 500 is in contact with the source electrode 800 between the trenches 350 adjacent to each other in a planar diagonal direction. The p type region 400 is disposed in the opening of the n+ region 500 in a planar mesh type. The P type region 400 fills the opening and is in contact with the n+ type region 500. The n type layer 300 is disposed in the center of the planar p type region 400.

Hereinafter, a specific structure of the semiconductor device according to an embodiment of the present invention will be described.

The n− type layer 200 is disposed on a first surface of the n+ type silicon carbide substrate 100, and the n type layer 300, the plurality of trenches 350, and the p type region 400 are disposed on the n− type layer 200.

Each of the trenches 350 includes a first trench 351 and a second trench 352. The second trench 352 is extended from a lower surface of the first trench 351, and the width of the first trench 351 is larger than the width of the second trench 352.

The p type region 400 is disposed on a side surface of each of the trenches 350. The n+ region 500 is disposed between the side surface of each of the trenches 350 and the p type region 400. The p type region 400 is in contact with a side surface of the second trench 352. The n+ type region 500 is in contact with the side surface and the lower surface of the first trench 351. Between the trenches 350 adjacent to each other in a planar diagonal direction, the n+ type region 500 is disposed on the p type region 400 (see FIGS. 3 and 4).

The n type layer is disposed between the trenches 350 adjacent to each other. Between the trenches 350 adjacent to each other in planar horizontal and vertical directions, the n type layer 300 is disposed between adjacent p type regions 400 (see FIGS. 2 and 3), and between the trenches 350 adjacent to each other in a planar diagonal direction, the n type layer 300 is disposed below the p type region 400 (see FIG. 4). Here, the ion doping concentration of the n type layer 300 is higher than the ion doping concentration of the n− type layer 200.

A gate insulating film 600 is disposed within each of the trenches 350. In addition, between the trenches 350 adjacent to each other in planar horizontal and vertical directions, the gate insulating film 600 is disposed on the n type layer 300, the p type region 400, and the n+ type region 500.

The gate electrode 700 is disposed on the gate insulating film 600. The gate electrode 700 may contain a metal or polysilicon.

The gate electrode 700 includes a first gate electrode 701 and a second gate electrode 702. The first gate electrode 701 is disposed within each of the trenches 350, and the second electrode 702 interconnects the first gate electrodes 701 adjacent to each other, between the trenches 350 adjacent to each other in planar horizontal and vertical directions. Here, the first gate electrode 701 serves as a trench gate electrode, and the second gate electrode 701 serves as a planar gate electrode.

An oxide film 710 is disposed on the gate electrode 700. Between the trenches 350 adjacent to each other in a planar diagonal direction, an oxide film 710 covers the side surface of the second gate electrode 702.

The source electrode 800 is disposed on the oxide film 710 and the n+ type region 500. The source electrode 800 is in contact with the n+ type region 500 between the trenches 350 adjacent to each other in a planar diagonal direction. The source electrode 800 may contain an ohmic metal.

The drain electrode 900 is disposed on a second surface of the n+ type silicon carbide substrate 110. The drain electrode 900 may contain an ohmic metal. Here, the second surface of the n+ type silicon carbide substrate 100 is disposed at the opposite side to the first surface of the n+ type silicon carbide substrate 100.

The channel of the semiconductor device according to an embodiment of the present invention includes a first channel 451 and a second channel 452. The first channel 451 is disposed in the p type region 400 in contact with the side surface of the second trench 352. That is, the first channel 451 is a channel by the first gate electrode 701 disposed in the trench 350, and is thus a vertical channel. The second channel 452 is disposed in the p type region 400 adjacent to the n+ type region 500 in contact with the side surface of the first trench 351, and disposed below the second gate electrode 702. That is, the second channel 452 is a channel by the second gate electrode 702, and is thus a horizontal channel.

As described above, the semiconductor device according to an embodiment of the present invention includes the first channel 451 as a vertical channel and the second channel 452 as a horizontal channel, so that the current density can be improved at the time of applying a forward voltage.

Then, characteristics of the semiconductor device according to the present embodiment will be described with reference to Table 1.

In Table 1, comparative example 1 represents a semiconductor device having only a horizontal channel, and comparative example 2 represents a semiconductor device having only a vertical channel.

TABLE 1

|  | breakdown voltage (V) | Turn-on voltage (mΩ · cm2) | current density (A/cm2) |
| --- | --- | --- | --- |
| Comparative Example 1 | 546 | 5.97 | 465 |
| Comparative Example 2 | 548 | 4.10 | 616 |
| exemplary embodiment | 539 | 2.52 | 1000 |

Referring to table 1, it can be seen that, at the similar breakdown voltage levels, the semiconductor device according to the present embodiment showed an about 58% reduction in the turn-on resistance and an about 115% increase in current density, compared with the semiconductor device according to comparative example 1. In addition, it can be seen that the semiconductor device according to the present embodiment showed an about 39% reduction in the turn-on resistance and an about 62% increase in current density, compared with the semiconductor device according to comparative example 2. Accordingly, the area of the semiconductor device according to an embodiment of the present invention can be reduced according to the increase in current density.

Then, a method for manufacturing the semiconductor device according to an embodiment of the present invention will be described with reference to FIGS. 5 to 10 together with FIGS. 1 to 4.

FIGS. 5 to 10 are views illustrating an example of a method for manufacturing the semiconductor device according to an embodiment of the present invention. In FIGS. 5 to 10, a method for manufacturing the semiconductor device according to an embodiment of the present invention will be described on the basis of one trench as an example.

Figure 5:
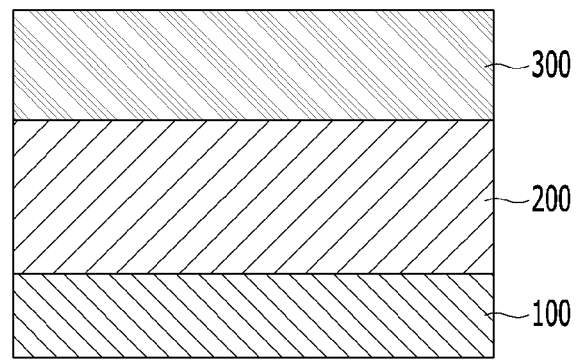
FIGS. 5 to 10 are views illustrating an example of a method for manufacturing the semiconductor device according to an embodiment of the present invention.

Referring to FIG. 5, an n+ type silicon carbide substrate 100 is prepared, an n− type layer 200 is formed on a first surface of the n+ type silicon carbide substrate 100, and an n type layer 300 is formed on the n− type layer 200. The ion doping concentration of the n type layer 300 is higher than the ion doping concentration of the n− type layer 200.

Here, the n− type layer 200 may be formed on a first surface of the n+ type silicon carbide substrate 100 through epitaxial growth, and the n type layer 300 may be formed on the n− type layer 200 through epitaxial growth.

Alternatively, the n− type layer 200 may be formed on the first surface of the n+ type silicon carbide substrate 100 through epitaxial growth, and the n type layer 300 may be formed by injecting n type ions into an upper surface of the n− type layer 200.

Figure 6:
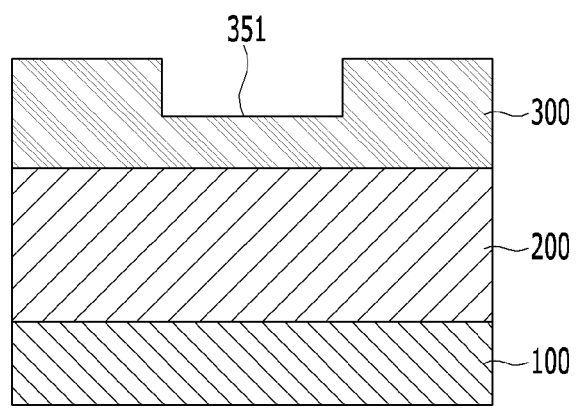

Referring to FIG. 6, a first trench 351 is formed by etching a portion of the n type layer 300. Here, a plurality of first trenches 351 are formed, and are formed in a planar matrix shape (see FIG. 1(b)).

Figure 7:
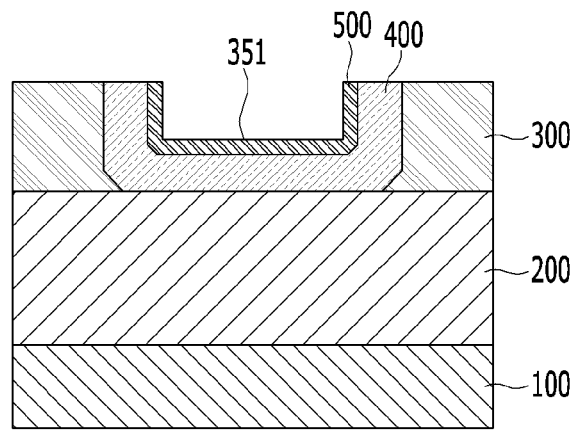

Referring to FIG. 7, p type ions are injected in the first trench 351 to form a p type region 400, and then n+ type ions are injected into the p type region 400 to form an n+ region 500. That is, the n+ type region 500 is disposed on a side surface and a lower surface of the first trench 351. In addition, the n+ type region 500 is disposed between the first trench 351 and the p type region 400.

In addition, the n+ type region 500 is formed on the p type region 400 between the trenches 350 adjacent to each other in a planar diagonal direction (see FIGS. 3 and 4).

Here, the n+ type region 500 is disposed in a planar mesh type with openings and formed to surround the first trench 351, and the p type region 400 is formed in the opening of the n+ type region 500 in a planar mesh type (see FIG. 1). In addition, the n type layer 300 is disposed in the center of the planar p type region 400. Here, the P type region 400 fill the planar opening and is in contact with the n+ type region 500.

Figure 8:
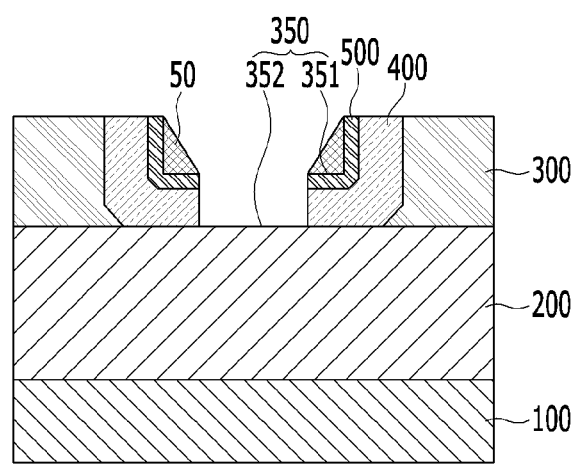

Referring to FIG. 8, a second trench 352 is formed by etching the n+ type region 500 and the p type region 400 disposed below the lower surface of the first trench 351. Therefore, the second trench 32 is extended from the lower surface of the first trench 351. The first trench 351 and the second trench 352 constitute a trench 350.

When the second trench 352 is formed, a spacer 50 is disposed on the side surface and a portion of the lower surface of the first trench 351, and then the n+ type region 500 and the p type region 400 are etched. Therefore, the width of the first trench 351 is larger than the width of the second trench 352. Here, the second trench 352 is formed using the spacer 50, and thus, when the second trench 352 is formed, the same mask as used in the formation of the first trench 351 may be used.

In addition, the p type region 400 is in contact with the side surface of the second trench 352. The n+ type region 500 is in contact with the side surface and the lower surface of the first trench 351.

Figure 9:
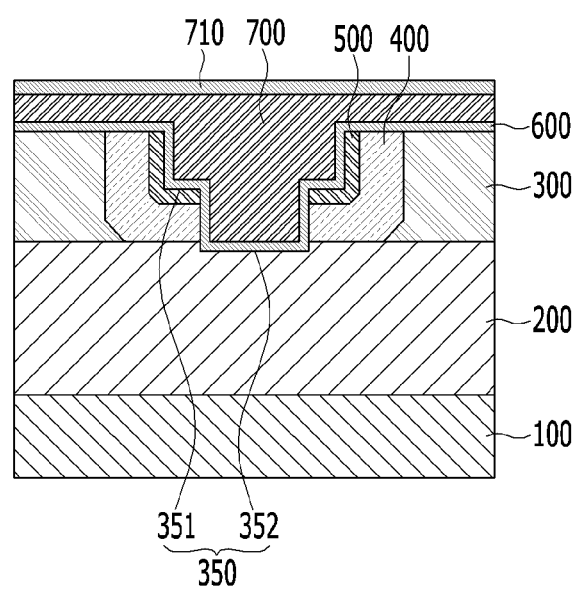

Referring to FIG. 9, the spacer 50 is removed, and then a gate insulating film 600 is formed within the trench 450, on the p type region 400, and on the n+ type region 500. Then, a gate electrode 700 is formed on the gate insulating film 600, and then an oxide layer 710 is formed on the gate electrode 700.

The gate electrode 700 includes a first gate electrode 701 and a second gate electrode 702. The first gate electrode 701 is disposed within the trench 350, and the second electrode 702 interconnects the first gate electrodes 701 adjacent to each other, between the trenches 350 adjacent to each other in planar horizontal and vertical directions (see FIGS. 2 and 3).

The gate insulating layer 600 and the gate electrode 700 expose a portion of the n+ type region 500 between the trenches 350 adjacent to each other in a planar diagonal direction, and an oxide film 710 is formed to cover a side surface of the gate electrode 700 (see FIGS. 3 and 4).

Figure 10:
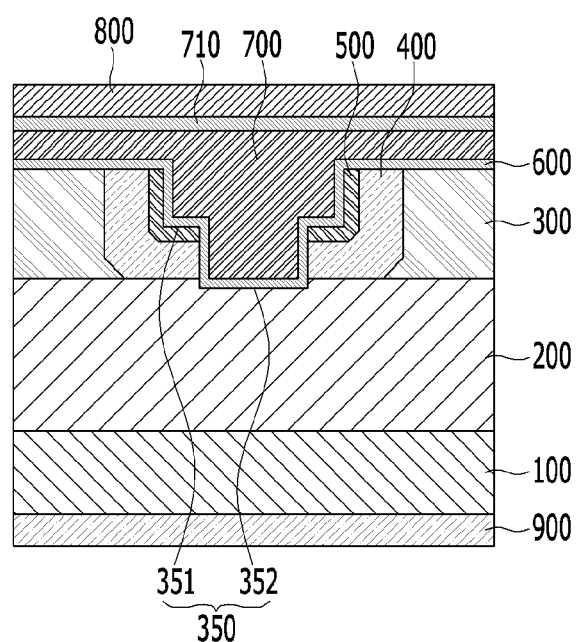

Referring to FIG. 10, a source electrode 800 is formed on the oxide film 710, and a drain electrode 900 is formed on a second surface of the n+ type silicon carbide substrate 100. The source electrode 800 is in contact with the n+ type region 500 between the trenches 350 adjacent to each other in a planar diagonal direction. The source electrode 800 and the drain electrode 900 may contain an ohmic contact.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A semiconductor device comprising an n+ type silicon carbide substrate, an n− type layer, an n type layer, a plurality of trenches, a p type region, an n+ type region, a gate insulating film, a gate electrode, a source electrode, a drain electrode, and a channel;
   wherein the plurality of trenches are disposed in a planar matrix shape;
   wherein the n+ type region is disposed in a planar mesh type with openings, surrounds each of the trenches, and is in contact with the source electrode between the trenches adjacent to each other in a planar diagonal direction; and
   wherein the p type region is exposed in the openings of the n+ type region in a planar mesh type;
   wherein the n+ type region comprises:
      a plurality of first lines extended in parallel to each other on the plane, and
      a plurality of second lines extended in parallel to each other on the plane; and
   wherein each of the plurality of first lines intersects with each of the plurality of second lines on the plane.

2. The semiconductor device of claim 1, wherein the n− type layer is disposed on a first surface of the n+ type silicon carbide substrate;
   wherein the n type layer, the plurality of trenches, and the p type region are disposed on the n− type layer;
   wherein the p type region is disposed within a side surface of each of the trenches; and
   wherein the n+ type region is disposed between the side surface of each of the trenches and the p type region.

3. The semiconductor device of claim 2, wherein each of the trenches includes a first trench and a second trench extended from a lower surface of the first trench; and
wherein a width of the first trench is larger than a width of the second trench.

4. The semiconductor device of claim 3, wherein the n+ type region is in contact with a side surface and a lower surface of the first trench; and
   wherein the p type region is in contact with a side surface of the second trench.

5. The semiconductor device of claim 4, wherein the gate insulating film is disposed inside the trench, on the n type layer, on the p type region, and on the n+ type region, the gate insulating film not overlying a portion of the n+ type region between the trenches adjacent to each other in a planar diagonal direction.

6. The semiconductor device of claim 5, wherein the gate electrode is disposed on the gate insulating film, and comprises a first gate electrode disposed inside the trench and a second gate electrode disposed on the n type layer, on the p type region, and on the n+ type region.

7. The semiconductor device of claim 6, wherein the second gate electrode interconnects the first gate electrodes adjacent to each other between the trenches adjacent to each other in planar horizontal and vertical directions.

8. The semiconductor device of claim 7, wherein the channel comprises:
   a first channel disposed in the p type region in contact with the side surface of the second trench; and
   a second channel adjacent to the n+ type region in contact with the side surface of the first trench and disposed in the p type region disposed below the second gate electrode.

9. The semiconductor device of claim 8, further comprising an oxide film disposed on the gate electrode, wherein the source electrode is disposed on the oxide film and the n+ region.

10. The semiconductor device of claim 9, wherein the drain electrode is disposed on a second surface of the n+ type silicon carbide substrate.

11. A method for manufacturing the semiconductor device of claim 1, the method comprising:
   sequentially forming the n− type layer and the n type layer on a first surface of the n+type silicon carbide substrate;
   forming a plurality of first trenches in the n type layer;
   implanting p type ions into each of the first trenches to form the p type region below a side surface and a lower surface of each of the first trenches;
   implanting n type ions into the p type region to form the n+ type region between each of the first trenches and the p type region;
   etching the n+ type region and the p type region below the lower surface of each of the first trenches to form a second trench;
   forming the gate insulating film inside the first trench and the second trench and on the p type region and the n+ type region;
   forming the gate electrode on the gate insulating film;
   forming an oxide film on the gate electrode;
   forming the source electrode on the oxide film and the n+ type region; and
   forming the drain electrode on a second surface of the n+ type silicon carbide substrate.

12. The method of claim 11, wherein a width of the first trench is larger than a width of the second trench.

13. The method of claim 12, wherein the n+ type region is in contact with the side surface and the lower surface of the first trench, and wherein the p type region is in contact with a side surface of the second trench.

14. The method of claim 13, wherein the gate electrode comprises a first gate electrode disposed inside the trench and a second gate electrode disposed on the n type layer, on the p type region, and on the n+ type region.

15. A semiconductor device comprising:
    an n+ type silicon carbide substrate;
    an n− type layer overlying the substrate;
    an n type layer overlying the n− type layer;
    a plurality of trenches disposed within the n-type layer, the plurality of trenches are disposed in a planar matrix shape;
    an n+ type region disposed in a planar mesh type with openings, wherein the n+ type region comprises a plurality of first lines extended in parallel to each other on the plane, and a plurality of second lines extended in parallel to each other on the plane, wherein each of the plurality of first lines intersects with each of the plurality of second lines on the plane so that the n+ type region surrounds each of the trenches;
    a p type region exposed in the openings of the n+ type region in a planar mesh type;
    a gate electrode;
    a gate insulating film between the gate electrode and the n− type layer;
    a source electrode being in contact with the n+ type region between the trenches adjacent to each other in a planar diagonal direction; and
    a drain electrode separated from the source electrode by the substrate.

16. The semiconductor device of claim 15, wherein the n− type layer is disposed on a first surface of the n+ type silicon carbide substrate;
    wherein the n type layer, the plurality of trenches, and the p type region are disposed on the n− type layer;
    wherein the p type region is disposed within a side surface of each of the trenches; and
    wherein the n+ type region is disposed between the side surface of each of the trenches and the p type region.

17. The semiconductor device of claim 15, wherein each of the trenches includes a first trench and a second trench extended from a lower surface of the first trench, a width of the first trench being larger than a width of the second trench.

18. The semiconductor device of claim 17, wherein the n+ type region is in contact with a side surface and a lower surface of the first trench, and wherein the p type region is in contact with a side surface of the second trench.

19. The semiconductor device of claim 15, wherein the gate insulating film is disposed inside each trench, on the n type layer, on the p type region, and on the n+ type region, the gate insulating film not overlying a portion of the n+ type region between the trenches adjacent to each other in a planar diagonal direction.

20. A semiconductor device comprising:
    an n+ type silicon carbide substrate;
    an n− type layer overlying the substrate;
    an n type layer overlying the n− type layer;
    a plurality of trenches disposed within the n-type layer, the plurality of trenches are disposed in a planar matrix shape;
    an n+ type region disposed in a planar mesh type with openings, the n+ type region comprising a single continuous region that surrounds each of the trenches;
    a p type region exposed in the openings of the n+ type region in a planar mesh type;
    a gate electrode;
    a gate insulating film between the gate electrode and the n− type layer;
    a source electrode being in contact with the n+ type region between the trenches adjacent to each other in a planar diagonal direction; and
    a drain electrode separated from the source electrode by the substrate.

* * * * *